United States Patent [19]

Bryan et al.

[11] Patent Number: 5,301,211
[45] Date of Patent: * Apr. 5, 1994

[54] FUEL ASSEMBLY SPUTTERING PROCESS

[75] Inventors: William J. Bryan, Granby; Patrick A. Perrotti, Newington, both of Conn.

[73] Assignee: Combustion Engineering, Inc., Windsor, Conn.

[*] Notice: The portion of the term of this patent subsequent to Dec. 21, 2010 has been disclaimed.

[21] Appl. No.: 924,732

[22] Filed: Aug. 3, 1992

[51] Int. Cl.$^5$ .............................................. G21C 19/00
[52] U.S. Cl. ................... 376/260; 376/449; 376/305; 204/192.16
[58] Field of Search .............. 376/261, 260, 449, 414, 376/415, 416, 417, 463, 305; 204/192.12, 192.15, 192.16, 298.21; 427/5, 6, 230, 237, 238, 239

[56] References Cited

U.S. PATENT DOCUMENTS

| | | | |
|---|---|---|---|
| 4,376,092 | 3/1983 | Kmonk et al. | 376/449 |
| 4,407,713 | 10/1983 | Zega | 204/298.21 |
| 4,541,984 | 9/1985 | Palmer | 376/415 |
| 4,645,643 | 2/1987 | Leclercq | 376/447 |
| 5,026,517 | 6/1991 | Menken et al. | 376/414 |

*Primary Examiner*—Daniel D. Wasil
*Attorney, Agent, or Firm*—L. James Ristas; John H. Mulholland

[57] ABSTRACT

A method for sputter coating the inside surface (30) of a fuel assembly tubular component (10) such as a control rod guide tube (200) with wear or corrosion resistant material. The steps include supporting the component tube in a fixture (12,14) and supporting a source tube (100,300) of e.g., wear resistant material, coaxially within the component tube, thereby defining a cylindrical annulus (24) between the tubes. The annular space is evacuated and backfilled with an inert working gas (26) such as argon, to a pressure sufficient to sustain a plasma discharge. The component tube is positively biased (36) as an anode, and the source tube is negatively biased (34) as a cathode, such that a plasma of the working gas is established in the annular space. A circumferential magnetic field is generated around the source tube to confine and shape the plasma whereby the source tube is bombarded with ions from the plasma substantially uniformly over the length of the source tube. Wear resistant material is thereby sputtered substantially uniformly from the source tube onto the inside surface of the component tube, to form a coating thereon.

20 Claims, 3 Drawing Sheets

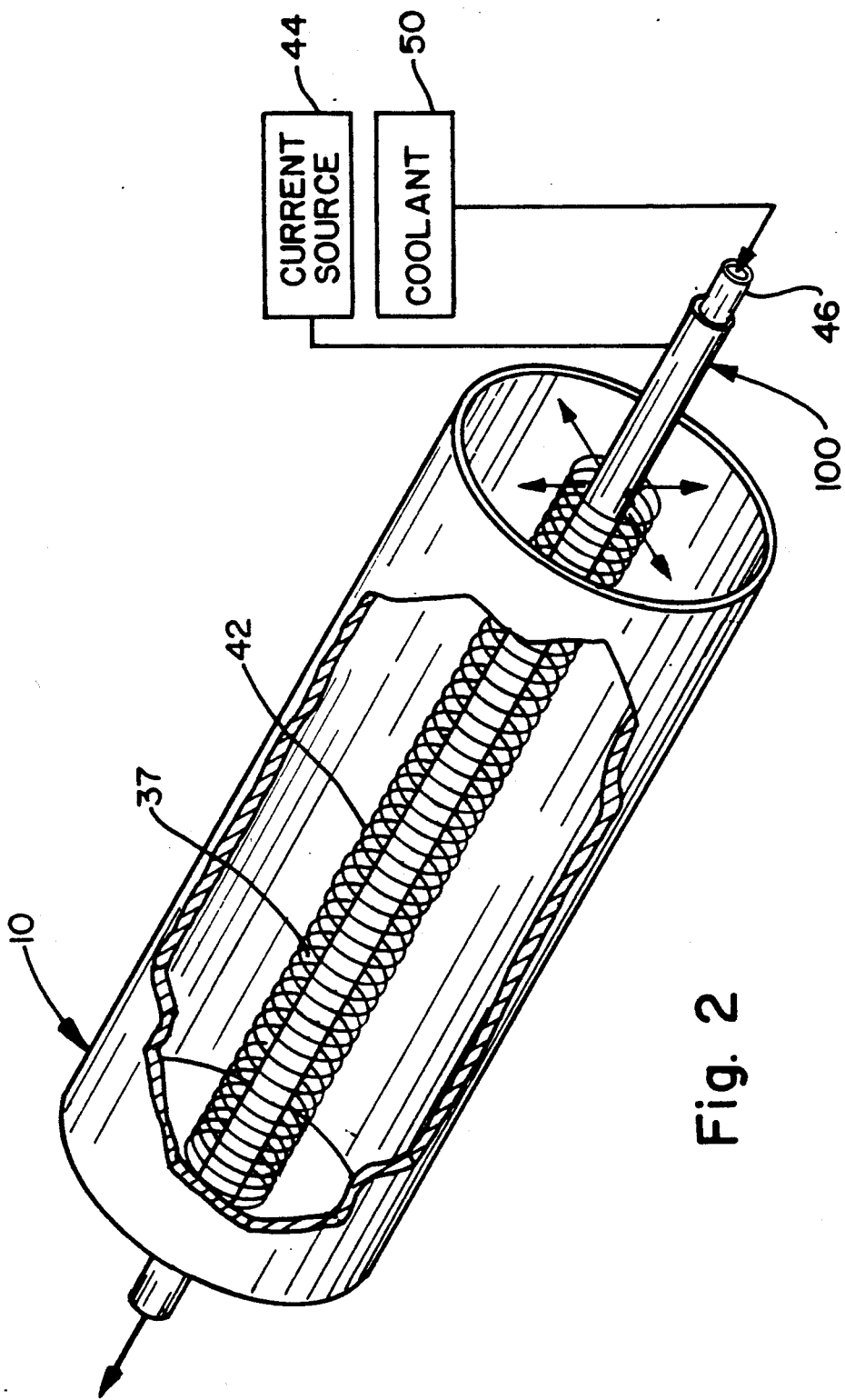

FUEL ASSEMBLY SPUTTERING PROCESS

BACKGROUND OF THE INVENTION

The present invention relates to nuclear fuel assemblies, and more particularly, to applying wear and/or corrosion-resistant coatings on fuel assembly components.

It is well known among nuclear fuel engineers, that corrosion and wear can occur in a variety of locations on a nuclear fuel assembly. These locations include the inside surface of nuclear fuel rods (i.e., the fuel cladding ID surface), and the inside surface of control rod guide tubes.

Attempts to reduce corrosion and wear within fuel rod tube cladding, are represented by U.S. Pat. No. 4,541,984 (Palmer), which discloses a getter-lubricant coating, preferably with a burnable poison material. The lubricant reduces stresses on the cladding resulting from the expansion or misalignment of fuel pellets acting against the inside clad surface. Furthermore, the getter material absorbs hydrogen atoms which would otherwise contribute to the initiation and propagation of corrosion, particularly at the areas of high stress within the cladding.

U.S. Pat. Nos. 4,376,092; 4,135,972; 4,284,475; 4,333,798 all disclose a sleeve of one form or another secured within a control rod guide tube, to protect the guide tube from excessive fretting wear. This wear results from vibratory movement of the control rod leading end, which remains in the upper portion of the guide tube even when the control rod is fully withdrawn from the reactor core. Typically, these wear sleeves are coaxially placed within the guide tubes in the upper end (top) of the fuel assembly. To accommodate these sleeves the guide tube is bulged to a larger diameter and the top grid likewise requires additional operations to open its guide tube cells to a larger size.

A number of techniques have been disclosed in the prior art, for coating the outside of fuel assembly components, for corrosion and/or wear resistance. U.S. Pat. Nos. 4,724,016 (Anthony) and 5,026,517 (Menken et al), are representative of these techniques. Such techniques are not readily adaptable for coating the inside surfaces of fuel assembly tubular components, which are generally at least 10 feet long, and have IDs which are often less than 0.5 inch.

SUMMARY OF THE INVENTION

The present invention is directed to an improved nuclear fuel assembly tubular component with a wear or corrosion-resistant internal coating that can maintain its integrity during operation.

The coating can be metal or ceramic that is sputtered onto to the inside surface of the tube. The coating is applied so that it bonds to the zircaloy surface of the tube and is chosen to have a thermal expansion co-efficient similar to the zircaloy tubing to enhance adhesion to the surface.

Although sputtering processes for applying coatings have been in general use for many years, sputtering has not previously been considered suitable for applying coatings to the internal surfaces of tubular components of nuclear fuel assemblies. This may be due in part to the very small inside diameter of the tubes, and the difficult task of adapting sputtering processes to depositing coatings on the inside of tubular members.

These problems have been overcome in accordance with the present invention, by the use of a magnatron enhanced plasma sputtering technique, in which a uniform coating can be applied on the inside tube surface, as a result of establishing a circumferential magnetic field to confine and shape the plasma.

The present invention is also directed to a method for sputter coating the inside surface of a fuel assembly tubular component with wear or corrosion resistant material. The steps include supporting the component tube in a fixture and supporting a source tube of e.g., wear resistant material, coaxially within the component tube, thereby defining a cylindrical annulus between the tubes. The annular space is evacuated and backfilled with an inert working gas such as argon, to a pressure sufficient to sustain a plasma discharge. The component tube is positively biased as an anode, and the source tube is negatively biased as a cathode, such that a plasma of the working gas is established in the annular space. A circumferential magnetic field is generated around the source tube to confine and shape the plasma whereby the source tube is bombarded with ions from the plasma substantially uniformly over the length of the source tube. Wear resistant material is thereby sputtered substantially uniformly from the source tube onto the inside surface of the component tube, to form a coating thereon.

In the preferred embodiment, the invention is directed to a method for coating the inside surface of a control rod guide tube with a wear resistant material, by the so-called Linear Magnatron Sputtering process. In this process, available from Surface Solutions, Inc., Boulder, Colo., the plasma between the source tube and the substrate (e.g., guide tube) is confined and shaped by a circumferential magnetic field around the source tube. A major advantage of this technique, is that it allows uniform high-rate sputtering radially outward from the surface of drawn, extruded, or cast tubing stock used as the source material. The circumferential magnetic field is generated by running high currents axially through a cooled copper tube centered within the source tube. This plasma shaping effects a constant plasma thickness that is uniformly excited over the whole length of the source tube. This is achieved because there is a plasma drift current, running in the plasma surrounding the source tube, parallel to the axis of the source tube. Other magnatron sputtering systems require that the drift current run in a closed loop. External magnets are not required for establishing the magnetic shaping field.

In the Linear Magnatron Sputtering System, the drift current may be boosted to a very high level at an initiating end, allowing the use of relatively simple tubular source cathodes. In addition to achieving higher sputtering rates, the sputtered material can also arrive at the substrate surface having higher impingement energy. Both the sputtering rate and the energy of the impingement can be independently controlled. Since the inside surfaces of the tubes can be coated in a static mode, the requirement for either moving or rotating the substrate during processing is largely reduced. This enables the use of a much simpler vacuum system, with longer processing periods between maintenance, less time required for maintenance activities, and fewer non-scheduled maintenance interrupts.

The process is also similar for sputtering a wear resistant material on the zircaloy fuel rod cladding. The interaction of fuel pellet holddown springs against the fuel cladding causes the wearing away of the cladding on the surface of the fuel rod. This condition can be eliminated by the coating one such material, ZrN on the inside of fuel rod in the area where the pellet holddown spring can interact with the cladding.

BRIEF DESCRIPTION OF THE DRAWINGS

These and other objects and advantages of the invention will be described below with reference to the accompanying figures, in which:

FIG. 2 is a schematic illustration showing certain details of the process represented by FIG. 1;

DESCRIPTION OF THE PREFERRED EMBODIMENT

Figure 1:
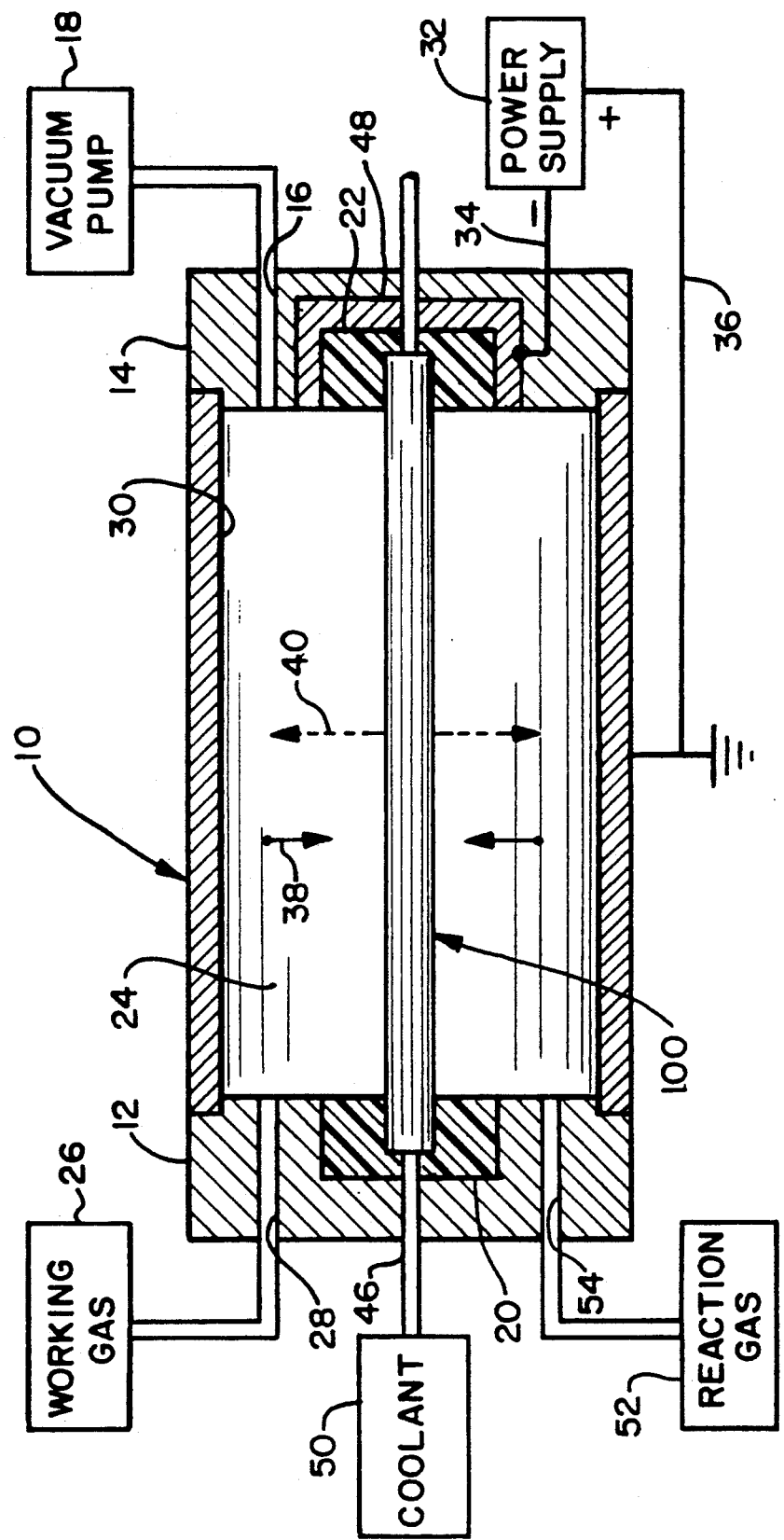
FIG. 1 is a schematic view of a component tube as fixtured during the coating process.

FIGS. 1 and 2 are schematic representations of the use of the so-called Linear Magnatron Sputtering technique, available from Surface Solutions, Inc., as adapted for implementing the present invention. In the preferred embodiment, a nuclear fuel assembly component such as fuel rod cladding or a control rod guide tube 10, made from zircaloy, is coated substantially uniformly along the entire inside surface, over substantially the full length of the tube. For illustrative purposes, the aspect ratio of the component tube 10 as shown in the Figures, has been substantially shortened relative to the typical tube dimensions of less than 0.5 inch ID and a length in excess of 12 ft.

The component tube 10 is fixtured such that first and second end plugs 12, 14 seal the tube interior. One end plug 14 has a vacuum port 16 through which a vacuum pump 18 can evacuate the content of the tube. The working gas port 28 may be situated in either end plug. Each end plug includes means, such as first and second mounts 20,22, for supporting a source tube 100 of wear or corrosion resistant material having a smaller outer diameter than the inner diameter of the component tube, coaxially within the component tube, thereby defining a cylindrical annulus 24 between the tubes. After evacuation, an inert working gas such as argon from source 26 is backfilled in the annulus 24 to a pressure sufficient to sustain a plasma discharge.

The source tube 100 in the normal implementation of the present invention, would be a homogeneous tube of the material which is desired to be coated on the inside surface, or substrate 30, of the cladding tube 10. In the preferred embodiment, a chemical reaction occurs in the space 24 between the source material from tube 100 and a reactive gas, in a manner to be described more fully below, whereby an oxide, nitride, or carbide is coated on the substrate. The source tube 100 can be at least the same length as the cladding tube 10.

A power supply 32 with negative lead 34 is connected through the connector mount or otherwise, to the source tube 100, and the positive lead 36 is connected to the substrate 30, such that the source tube serves as a cathode and the substrate serves as an anode. A plasma 37 consisting of positive argon ions and electrons is established in the annular space 24, with the positive ions 38 bombarding the cathode 100 with sufficient energy to vaporize surface atoms from the source tube 100 onto the substrate 30. Because the source material is passed into the vapor phase 40 by a mechanical process (momentum exchange) rather than a chemical or thermal process, virtually any material is a candidate for coating. Thus metals, glasses and other ceramics having desirable wear and corrosion-resistant properties can be utilized.

The plasma in the annular space can be established by any known means, such as direct current discharge when sputtering metals, but in order to improve the efficiency, magnatron techniques are applied to confine and shape the plasma. In the Linear Magnatron Sputtering technique available from Surface Solutions, Inc. a circumferential magnetic field 42 is established around the source tube 100 by running high currents from current source 44 axially through a copper tube 46 centered within the source tube and cooled by coolant 50, as shown in FIG. 2. This achieves a uniform rate of material evaporation along the length of the source tube 100, because of a constant plasma thickness that is uniformly excited over the whole length of the source tube. This results from the plasma drift current in the plasma surrounding the source tube, running in a direction parallel to the axis of the source tube 100. This is far superior to cylindrical post sputtering schemes, which require that the drift current run in a closed loop. In the Linear Magnatron Sputtering System of the present invention, the drift current may be boosted with an enhancer device shown generally at 48, to a very high level at one end of the source tube.

It should thus be appreciate that to the extent a plasma of constant thickness can be maintained in uniform excitation over the full length of the source tube 100, the radially projecting source atoms 40 will coat the full surface 30 of the cladding tube substantially uniformly. Under many circumstances, satisfactory results are obtained if at least about ten feet along a twelve foot tube, is coated. It should also be appreciated that in the embodiment described in FIG. 1, the component tube 10 itself serves as the boundary of the evacuation chamber 24. An alternative embodiment would encapsulate the tube 10 within an outer vacuum chamber (not shown), in which case the fixturing and end plug arrangements would have analogous counterparts in the walls of the vacuum chamber.

Once initiated, the flux of sputtered material leaving the source tube 100 will continue until a substantially uniform coating of, for example, a thickness of 0.0002 inch is achieved, whereupon the process is stopped, the end plugs removed, and the next tube fixtured for restarting the coating process.

Figure 3A:
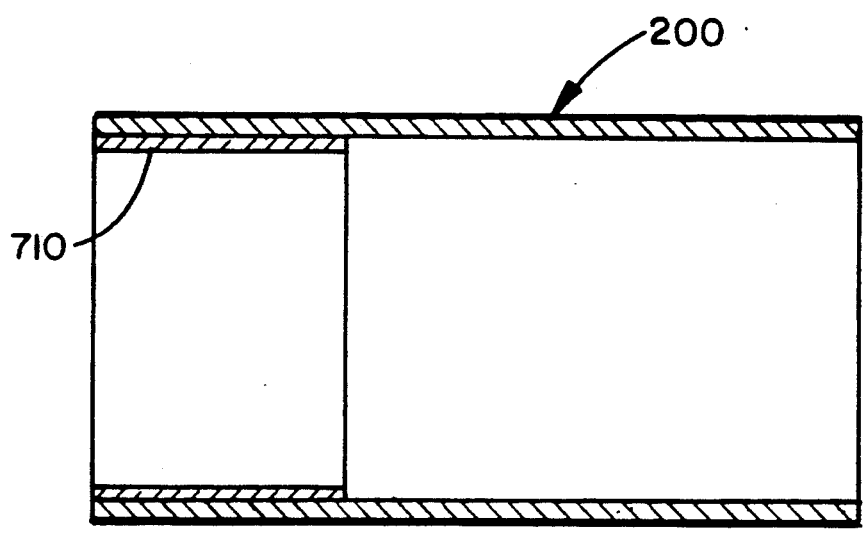
FIGS. 3a and 3b show a schematic of the component tube with a source tube of material non-uniformly distributed so as to produce a non-uniform coating on the inside of the substrate tube.
Figure 3B:
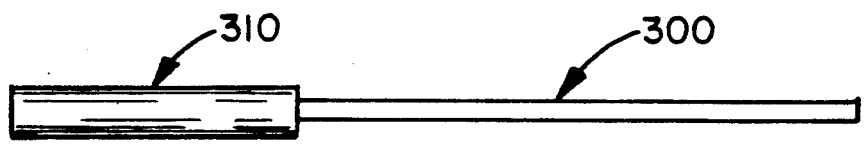

FIG. 3 shows an alternative embodiment of the process, and the coated tube resulting from such processes. In FIG. 3, the cladding or guide tube 200 has a non uniform but prescribed distribution of coating material, as a result of a commensurate non uniform, but prescribed distribution of material on source tube 300. For example, if component 200 is a control rod guide tube, the upper or left portion as shown in FIG. 3a can be coated at 210 over only a limited axial distance, e.g., less than one half the guide tube length, extending to just below the "withdrawn" portion of the control rod tips in the nuclear reactor. The source tube 300 has a correspondingly limited region of source material 310. Thus, the coating can be limited to partial lengths within the rod by shortening the length of source tube.

As mentioned above, the process according to the present invention is amenable to the sputter coating of a wide variety of potentially useful materials. Some of these materials cannot readily be sputtered from a homogeneous source tube, but rather can be formed either chemically in the inert gas via chemical reaction, or at the internal surface of the component tube. The coatings are thus applied by analogy to reactive chemical deposition processes. A source 52 of reaction gas including nitrogen, oxygen, or carbon and associated plug port 54 are shown in FIG. 1 for this purpose.

Table 1 lists a variety of metals and metallic compounds that can be sputtered in accordance with the present invention:

TABLE 1

| Metals and Metallic Compounds |
| --- |
| ZrN |
| TiN |
| CrN |
| HfN |
| TiAlVN |
| TaN |

Table 2 is a representative list of ceramic materials including glasses that are usable with the present invention:

TABLE 2

| Ceramics and Glasses |
| --- |
| $Zr_2O_3$ |
| $Al_2O_3$ |
| TiCN |
| TiC |
| CrC |
| ZrC |
| WC |
| Calcium Magnesium aluminosilicate |
| Sodium Borosilicate |
| Calcium Zinc borate |

We claim:

1. A method for coating the inside surface of a nuclear fuel assembly tubular component with a wear resistant metallic, ceramic or glass material, comprising:
   supporting the component tube in a fixture;
   supporting a source tube of said material coaxially within the component tube, thereby defining a cylindrical annular space between the tubes;
   evacuating the annular space and backfilling the annular space with an inert working gas to a pressure sufficient to sustain a plasma discharge;
   connecting a power supply to the component tube with a positive bias as an anode and to the source tube with a negative bias as a cathode, such that a plasma of the working gas is established in the annular space;
   establishing a circumferential magnetic field around the source tube to confine and shape the plasma;
   whereby the source tube is bombarded with ions from the plasma and said material is thereby sputtered from the source tube onto the inside surface of the component tube to form a coating thereon.

2. The method of claim 1, wherein
   the component tube has a length of at least about 12 ft and the source tube spans the length of the cladding tube; and
   said material is sputtered along at least about 10 ft of the component tube simultaneously.

3. The method of claim 2, wherein
   the source tube has a prescribed non-homogenous distribution of said material along its length, and said material is sputtered onto the component tube in a prescribed, non-homogeneous distribution along the length of the component tube.

4. The method of claim 1, wherein the source tube material is selected from the group consisting of ceramics and glasses.

5. The method of 1, wherein the step of backfilling includes backfilling with a reactant gas which in the presence of the plasma and the sputtered material, chemically reacts with the sputtered material to form a compound material coating on the component tube.

6. The method of claim 5, wherein the compound material is an oxide, nitride or carbide.

7. The method of claim 5, wherein the reactant gas is nitrogen.

8. The method of claim 7, wherein the compound material is selected from the group consisting of ZrN, TiN, CrN, HfN, TiAlVN, and TaN.

9. The method of claim 5, wherein the reactant gas includes oxygen.

10. The method of claim 9, wherein the compound material is selected from the group consisting of $Zr_2O_3$ and $Al_2O_3$.

11. The method of claim 5, wherein the reactant gas includes carbon.

12. The method of claim 11, wherein the compound material is selected from the group consisting of TiCN, TiC, CrC, ZrC, and WC.

13. A method for coating the inside surface of a zircaloy control rod guide tube with a wear-resistant metallic compound material, comprising:
   supporting the guide tube in a fixture;
   supporting a source tube of metallic material coaxially within the cladding tube, thereby defining a cylindrical annular space between the tubes;
   evacuating the annular space and backfilling the annular space with an inert working gas and a reactant gas to a pressure sufficient to sustain a plasma discharge;
   connecting a power supply to the guide tube with a positive bias as an anode and to the source tube with a negative bias as a cathode, such that a plasma of the working gas is established in the annular space;
   establishing a circumferential magnetic field around the source tube to confine and shape the plasma;
   whereby the source tube is bombarded with ions from the plasma and metallic material is thereby sputtered from the source tube so as to react with the reactant gas to form said metallic compound which is deposited as a coating on the inside surface of the guide tube.

14. The method of claim 13, wherein
   the guide tube has a length of at least about 12 ft and the source tube spans the length of the cladding tube; and
   the metallic material is sputtered along at least about 10 ft of the cladding tube simultaneously.

15. The method of claim 13, wherein
   the source tube has a prescribed non-homogenous distribution of metallic material along its length, and
   the metallic compound is sputtered simultaneously onto the cladding tube in a prescribed, non-homogeneous distribution along the length of the guide tube.

16. The method of claim 13, wherein the metallic compound is sputtered along less than one half the length of the guide tube.

17. A method for coating the inside surface of a zircaloy control rod guide tube with a wear resistant ceramic compound, comprising:

supporting the guide tube in a fixture;

supporting a source tube of metallic material coaxially within the cladding tube, thereby defining a cylindrical annular space between the tubes;

evacuating the annular space and backfilling the annular space with an inert working gas and a reactant gas to a pressure sufficient to sustain a plasma discharge;

connecting a power supply to the guide tube with a positive bias as an anode and to the source tube with a negative bias as a cathode, such that a plasma of the working gas is established in the annular space;

establishing a circumferential magnetic field around the source tube to confine and shape the plasma;

whereby the source tube is bombarded with ions from the plasma and metallic material is thereby sputtered from the source tube so as to react with the reactant gas to form said ceramic compound which is deposited as a coating on the inside surface of the guide tube.

18. The method of claim 17, wherein the guide tube has a length of at least about 12 ft and the source tube spans the length of the cladding tube; and the metallic material is sputtered along at least about 10 ft of the cladding tube simultaneously.

19. The method of claim 17, wherein the source tube has a prescribed non-homogenous distribution of metallic material along its length, and the metallic is sputtered simultaneously onto the cladding tube in a prescribed, non-homogeneous distribution along the length of the guide tube.

20. The method of claim 17, wherein the metallic compound is sputtered along less than one half the length of the guide tube.

* * * * *